United States Patent
Han

(10) Patent No.: US 6,483,765 B2
(45) Date of Patent: Nov. 19, 2002

(54) SEMICONDUCTOR MEMORY DEVICE AND BIT LINE CONNECTING METHOD THEREOF

(75) Inventor: Jong Hee Han, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/750,219

(22) Filed: Dec. 29, 2000

(65) Prior Publication Data

US 2001/0014050 A1 Aug. 16, 2001

(30) Foreign Application Priority Data

Dec. 30, 1999 (KR) .............................. 99-66544

(51) Int. Cl.[7] ................................ G11C 8/00
(52) U.S. Cl. .................. 365/230.03; 365/191; 365/203; 365/207; 365/189.11; 365/230.06
(58) Field of Search ............................ 365/230.03, 191, 365/203, 205, 207, 230.01, 189.01, 230.06, 189.11

(56) References Cited

U.S. PATENT DOCUMENTS

| 5,016,224 A | | 5/1991 | Tanaka et al. |
| 5,377,151 A | * | 12/1994 | Komuro ..................... 365/208 |
| 5,594,704 A | * | 1/1997 | Konishi et al. ............. 365/233 |
| 5,973,975 A | | 10/1999 | Raad |

FOREIGN PATENT DOCUMENTS

GB  2 314 651 A  1/1998

\* cited by examiner

*Primary Examiner*—Hoai Ho
(74) *Attorney, Agent, or Firm*—Pillsbury Winthrop LLP

(57) ABSTRACT

The present invention discloses a semiconductor memory device and bit line connection method thereof. A control signal for connecting bit line sense amplifiers drives at a high voltage level of Vpp and thereafter is limited as to when it can transition to a power voltage Vdd level or a ground voltage level, thereby reducing a power consumption in data read, write and refresh operations. Accordingly, power consumption of the semiconductor memory device is reduced, in particular, for a memory device that supports a self refresh mode or an automatic refresh mode.

11 Claims, 6 Drawing Sheets

SEMICONDUCTOR MEMORY DEVICE AND BIT LINE CONNECTING METHOD THEREOF

BACKGROUND OF THE INVENTION

1. Field of the Invention

The present invention relates in general to semiconductor memory. More specifically, the invention relates to a semiconductor memory device and bit line connecting method thereof.

2. General Background and Related Art

Portable electronic devices, like a notebook computer or portable game devices, which are operated by battery power are designed to conserve power as much as possible to extend operating time for a given set of batteries. Many devices have significant amounts of memory so it is important that semiconductor memory devices be operated with low power consumption. Such devices have been developed. For example, see U.S. Pat. No. 6,061,276, entitled "SEMICONDUCTOR MEMORY DEVICE AND A SEMICONDUCTOR INTEGRATED CIRCUIT".

Generally, a semiconductor memory device has a plurality of memory cells arranged in an array. Adjacent memory cell arrays shares a bit line sense amplifier array which is generally constructed and arranged between the memory cell arrays. A switch array is constructed and arranged between the bit line sense amplifier array and memory cell array. A control signal for switching is applied to the switch array.

The bit line sense amplifier is connected to any memory cell array according to an activation state of an adjacent memory cell array in order to read/write or refresh data to the memory cell array, and is not connected to an adjacent another memory cell simultaneously. The control is dependent on the switching state of the switching array.

Precharge and Activation operations are repeated periodically in order to read/write or refresh data by accessing to a word line of the memory cell array, and a switching array is driven for performing the above operations and a state of the control signal. In other words, an applied voltage is changed for driving the switching array.

Specifically, at the beginning, a voltage of each gate of the switching array is maintained at the power voltage Vdd level and thereafter the voltage, applied to the gate of the switching array, transitions to a high voltage Vpp level in order to make sure a memory cell array in which an access is selected and an adjacent bit line sense amplifier connect, and the voltage, applied to the gate of the switching array, is lowered to a ground voltage level in order to make a connection state of a memory cell array in which an access is not selected and an adjacent bit line sense amplifier disconnect. Thereafter, the control signal is set at the power voltage Vdd level for a precharge operation.

The following example is different from the above-mentioned: in a precharge state, a control signal is set at a high voltage Vpp and in an activation state, the control signal is set to lower a ground voltage level in order to disconnect a connection state of the switching array which is positioned at a non-selected memory cell array.

The operations of the conventional art must be performed every refresh cycle including activation and precharge operations. Accordingly, the higher the number of on/off times of the switching array is, the greater the power consumption is. A self-refresh mode can be provided at a low power consumption. Power consumption for on/off operations of the switching array is very high.

The switching array is operated frequently. It has a high load and uses a voltage Vpp that is higher than an operational voltage Vdd, for switching, and current must be provided to a circuit for providing the high voltage Vpp. Accordingly, a large amount of current is consumed for performing the above operations.

SUMMARY

With this background in mind, the present inventions feature a semiconductor memory arranged wherein a control signal for connecting bit line sense amplifiers drives at a high voltage level Vpp and thereafter prevents lowering it to an operational voltage level Vdd or a ground voltage level, thereby reducing a power consumption in data read, write and refresh operations.

The present inventions feature reduced power consumption of a semiconductor memory device by restricting a voltage change state of a control signal applied for controlling connection states of bit line sense amplifiers and memory cells.

Power consumption is reduced by limiting the voltage changes of a control signal. The control signal is provided for switching a switching array which causes a plurality of memory cell arrays and bit line sense amplifiers corresponding to the memory cell arrays to be connected together.

Some of the claimed inventions define a semiconductor memory device including a plurality of memory cell arrays. Bit line sense amplifier arrays includes a bit line sense amplifier arranged between the memory cell arrays and shared. One or more switching arrays are arranged between the bit line sense amplifiers and the memory cell arrays corresponding to the bit line sense amplifiers, respectively, and for switching the connection states therebetween. Bit line selection control means control repeatedly an activation and a precharge of each memory cell array and provide control signals corresponding to the activation and precharge to the switching arrays.

A bit line selection control unit provides mode control signals, wherein a control signal applied to switching arrays is a high voltage level. The modes of operations include: 1) a first mode for maintaining the high voltage level during a precharge period and successively an activation period; 2) a second mode for lowering it to a ground voltage level during successively an activation period after maintaining a high voltage level during a precharge period; 3) a third mode for maintaining a power voltage level during a precharge period and raising it to a high voltage level during successively activation period when the control signal is a power voltage level at the present activation period; 4) a fourth mode for maintaining the power voltage level during a precharge period and thereafter lowering to the ground voltage level during a successive activation period; 5) a fifth mode for maintaining the power voltage level during the precharge period and the successive activation period; 6) a sixth mode for raising to the power voltage level at the precharge period when the control signal is the ground voltage level at the present activation period and thereafter to a high voltage level at a successive activation period; 7) a seventh mode for raising to the power voltage level at the precharge period and thereafter maintaining the power voltage level at a successive activation period; and 8) an eighth mode for raising to the power voltage level at the precharge period and thereafter lowering to the ground voltage level at a successive activation period.

BRIEF DESCRIPTION OF THE DRAWINGS

The present invention will become better understood with reference to the accompanying drawings, which are given only by way of illustration and thus are not limiting of the present invention, wherein.

DETAILED DESCRIPTION

An exemplary embodiment of a semiconductor memory device in accordance with the principles of the inventions will now be described with reference to the accompanying drawings.

Figure 1:
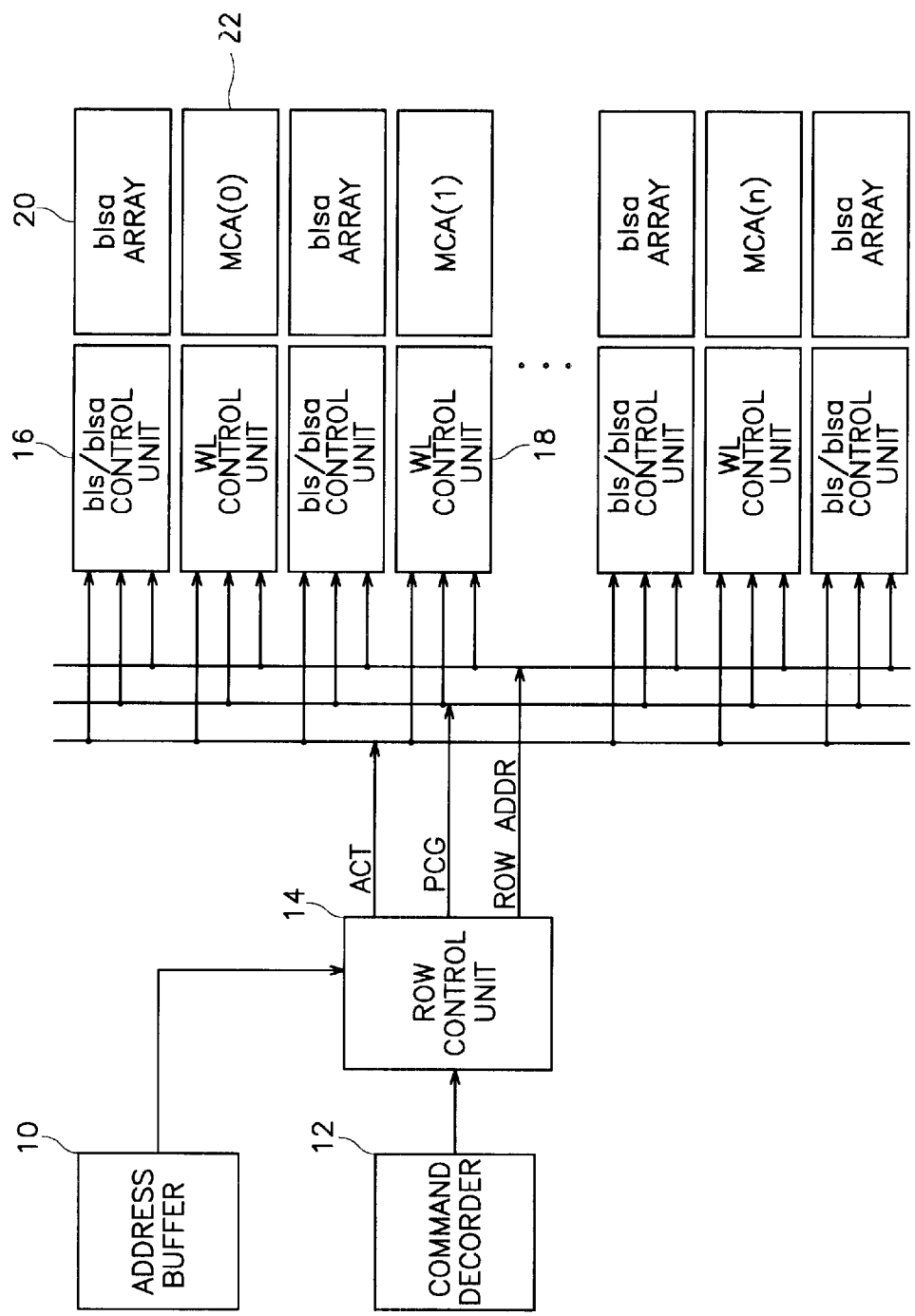
FIG. 1 is a block diagram of an exemplary preferred embodiment of a semiconductor memory device in accordance with the present invention.

FIG. 1 is a block diagram of an exemplary preferred embodiment of a semiconductor memory device in accordance with the present invention. The semiconductor memory device comprises an address buffer 10 and a command decoder 12 for providing an address signal and a plurality of command signals for controlling states such as a row active or a precharge to a row control unit 14, respectively. The row control unit 14 provides a row active control signal ACT and a precharge control signal PCG, and a row address signal ROW_ADDR to a bit line selection (hereinafter, which is referred to 'bls')/bit line sense amplifier (hereinafter, which is referred to 'blsa') control unit 16 and a word line (hereinafter, which is referred to 'WL') control unit 18, respectively.

Figure 2:
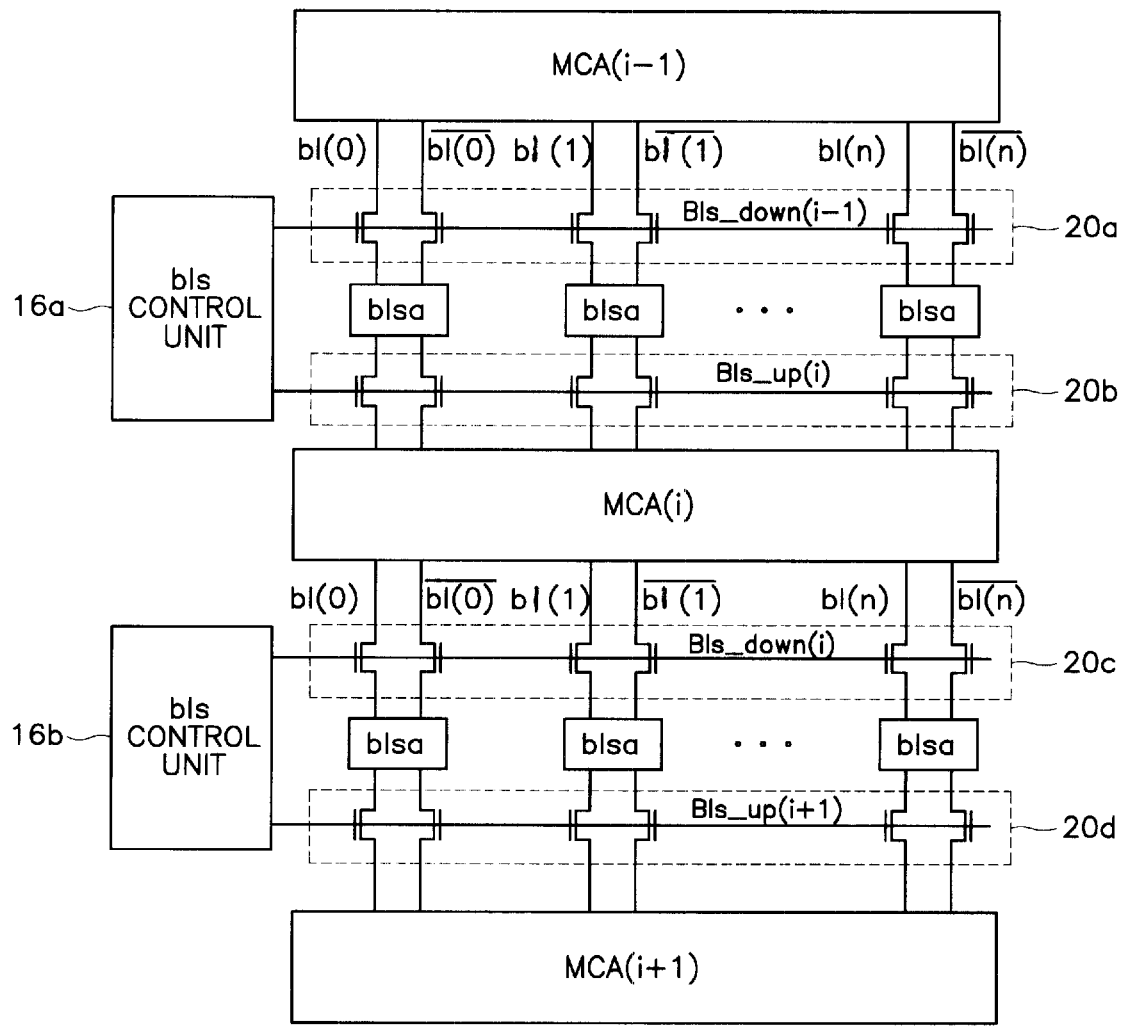
FIG. 2 is a circuit illustrating a connection relation of a memory cell array and a bit line sense amplifier array of FIG. 1.

Each bls/blsa control unit 16 is constructed by combining a bls control unit 16a (FIG. 2) and a blsa control unit (not shown). The WL control unit 18 controls a corresponding memory cell array 22 (hereinafter, which is referred to 'MCA'). The construction of the blsa control unit for controlling the blsa and the WL control unit for controlling the MCA 22 is the same as that of the conventional art and accordingly, a specific explanation of the construction will omitted for clarifying a specification of the present invention, an explanation of a construction and an operation of bls control unit 16a will be described as follows.

The bls control units 16a and 16b are constructed and arranged so that there is a one to one correspondence with the blsa arrays 20. Each blsa array 20 has bit line sense amplifiers blsa corresponding to each bit line pair on a one to one correspondence. The blsa is constructed and arranged to be connected it to two memory cell arrays 22 which are adjacent to each bit line of the blsa through switches composed of MOS transistors. The switches are arranged to switching arrays 20a~20d.

More specifically, memory cell arrays of MCA(i−1) and MCA(i+1) are adjacent to an i-th memory cell array of MCA(i) (i is an arbitrary natural number), respectively. The memory cell arrays of MCA(i) and MCA(i−1) or MCA(i) and MCA(i+1), which are adjacent to each other share bit line sense amplifiers blsa, arranged between those memory cell arrays. The bit line sense amplifiers blsa is connected to the memory cell arrays MCA(i) and MCA(i−1) or MCA(i) and MCA(i+1) which are adjacent to both sides of the bit line sense amplifiers blsa through a pair of bit lines ((bl(0), /bl(0) ),(bl(1), /bl(1)), . . .((bl(n), /bl(n):n is an arbitrary natural number), and the above connection state is determined according to the on/off states of the respective switches which are included to the switching arrays 20a~20d of each bit line.

Among the switching arrays 20a and 20b connected to bit line sense amplifiers blsa positioning between the memory cell arrays MCA(i−1) and MCA(i), a control signal, which is applied to gates of the switches from the bls control unit 16a, for controlling on/off states of the switches included to the switching array 20a is designated bls_down (i−1), and a control signal, which is applied to gates of the switches from the bls control unit 16a, for controlling on/off states of the switches included to the switching array 20b is designated bls_up(i).

Among the switching arrays 20c and 20d connected to bit line sense amplifiers blsa positioning between the memory cell arrays MCA(i) and MCA(I+1), a control signal, which is applied to gates of the switches from the bls control unit 16b, for controlling on/off states of the switches included to the switching array 20d is designated bls_down(i), and a control signal, which is applied to gates of the switches from the bls control unit 16b, for controlling on/off states of the switches included to the switching array 20d is designated bls_up(i+1).

As a result, the blsa array 20 (FIG. 1) comprises a pair of switching arrays and bit line sense amplifiers blsa corresponding to each bit line pair, and the bls control unit included to the bls/blsa control unit 16 corresponding to the blsa array 20 outputs a pair of control signals for controlling a pair of switching arrays constructed to the blsa array 20.

Constructed and arranged as described above and as shown in the drawings, the configuration restricts the change of the control signals outputted for driving the switching array 20a and reduces the power consumption.

Figure 3:
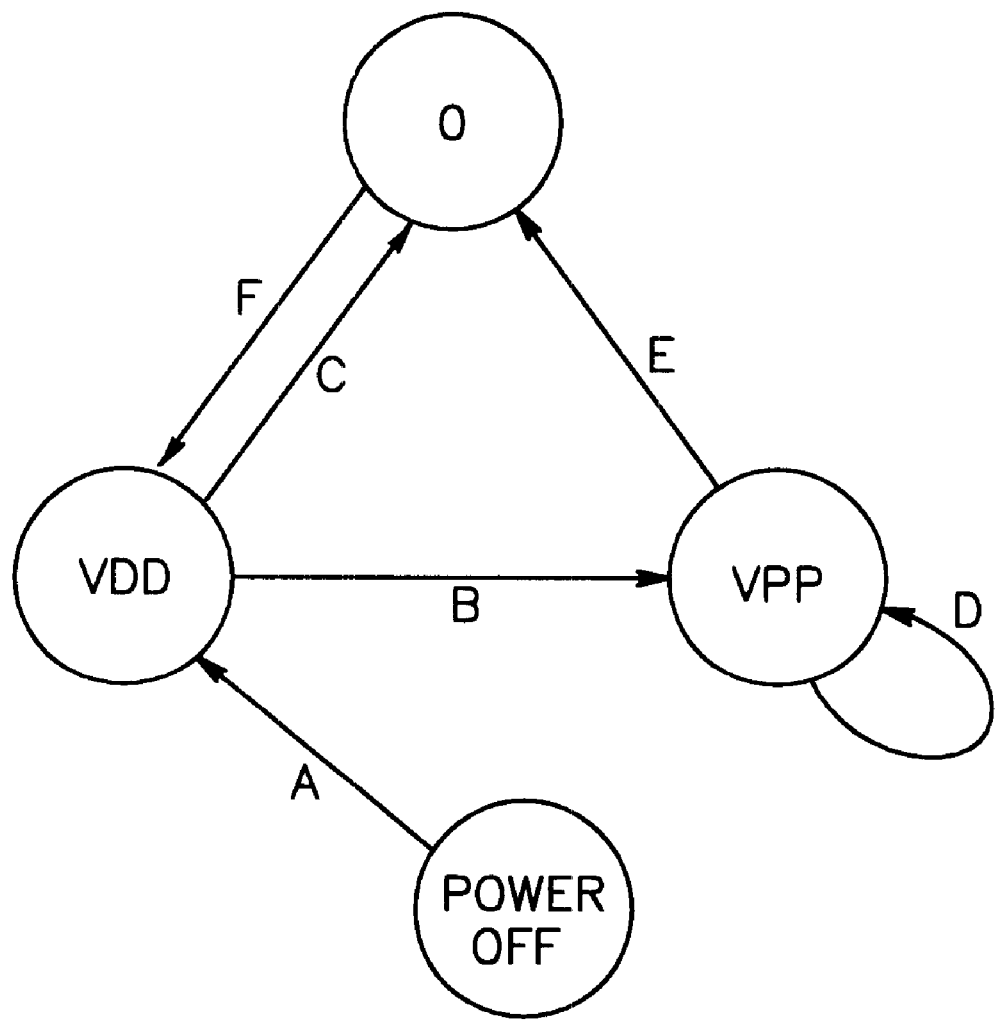
FIG. 3 is a state diagram illustrating a connection method of a bit line of a semiconductor memory device in accordance with the present invention.

FIG. 3 is a state diagram illustrating a connection method of a bit line of a semiconductor memory device in accordance with the present invention. When turning on the semiconductor memory device, the bls control units 16a and 16b are set the whole control signals Bls_down(i−1), bls_up(i), bla_down(i), and bls_up(i+1) at a power voltage Vdd level (a path A of FIG. 3). When a memory cell array of MCA(i) is selected optionally as an active state, the control signal bls_up(i) outputted from the bls control unit 16a and the control signal bls_down(i) outputted from the bls control unit 16b are ascended at a high voltage Vpp level, thereby turning on the corresponding switching arrays 20b and 20c (path B of FIG. 3). Accordingly, the memory cell array MCA(i) is connected to the bit line sense amplifiers blsa, which are adjacent to its both sides. Simultaneously, the bls control units 16a and 16b transitions the control signals bls_down(i−1) and bls(i+1) for controlling the switching arrays 20a and 20d connected to the memory cell arrays MCA(i−1) and MCA(i+1), in which an activation does not selected, at a ground voltage level (a path C of FIG. 3).

Successively, the memory cell array MCA(i) is non-activated and when other adjacent memory cell array MCA (I−1) is selected at an active state, the bls control unit 16a maintains the control signal bls_up(i) to the present high voltage Vpp level, although a precharge signal PCG is inputted (a path D of FIG. 3), and thereafter transitions to a ground voltage level when a control for an activation is performed by a row active control signal ACT (a path E of FIG. 3).

The bls control unit 16a causes a control signal to transition from ground voltage to a power voltage level Vdd when precharging (path F of FIG. 3) in order to control the switching array 20a adjacent to the memory cell array MCA(i−1) which will be activated together with the process for non-activating the memory cell array MCA(i) and thereafter to a high voltage level Vpp for activating (a path B of FIG. 3).

Figure 4:
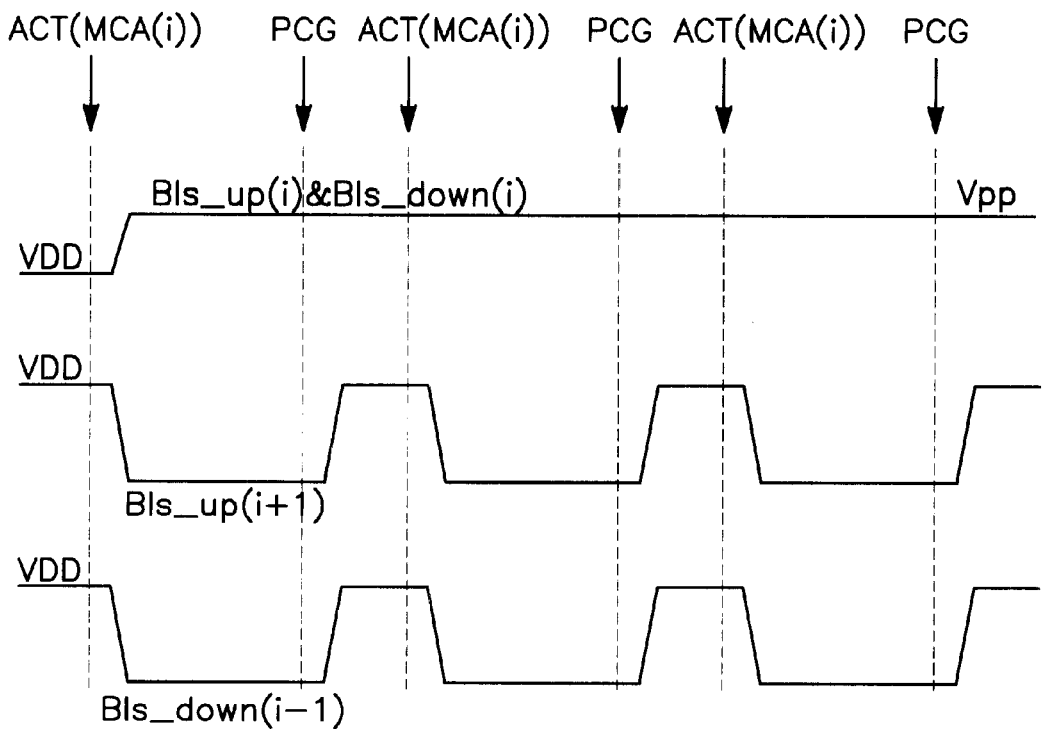
FIG. 4 is a timing diagram illustrating in a case of continuously selecting a one-memory cell array in accordance with the method of FIG. 3.
Figure 5:
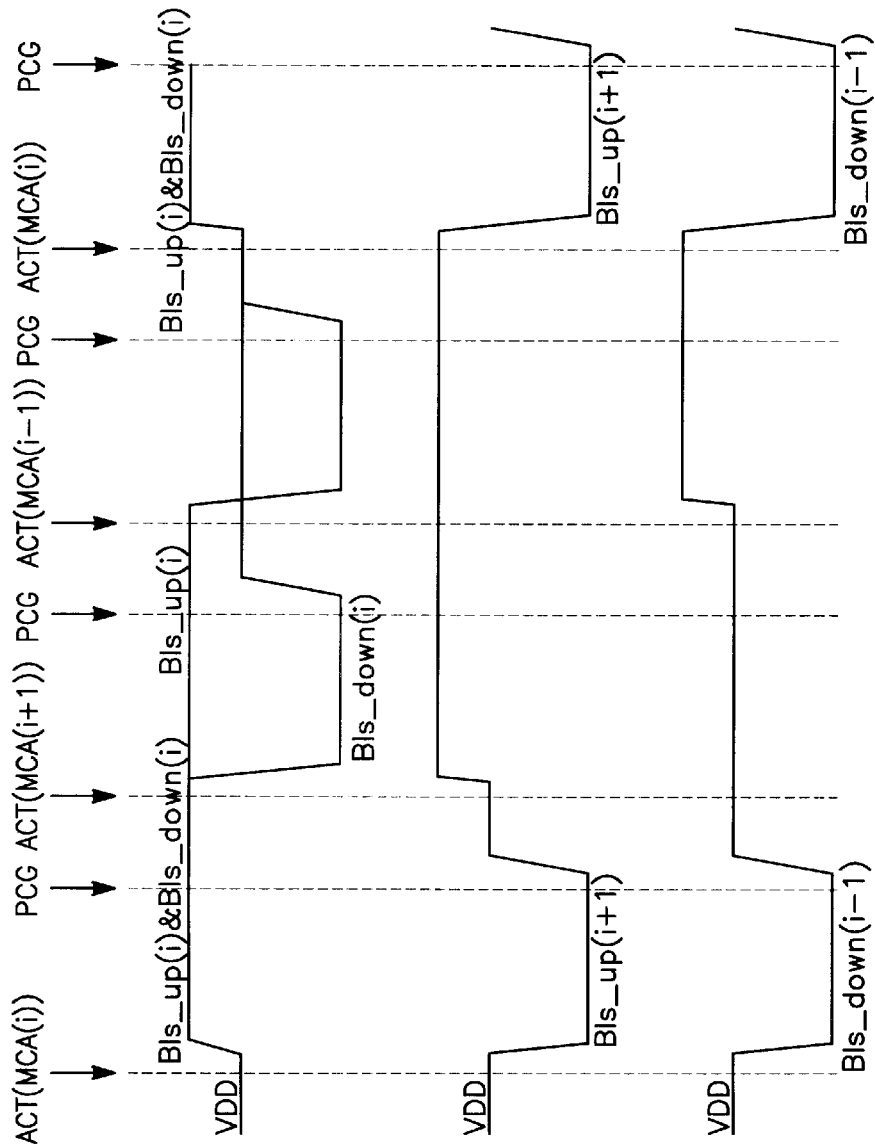
FIG. 5 is a timing diagram illustrating in a case of continuously selecting a one-memory cell array in accordance with the method of FIG. 3.

FIG. 4 is a timing diagram illustrating in a case of continuously selecting a one-memory cell array in accordance with the method of FIG. 3. FIG. 4 illustrates a case that a one-memory cell array is selected as an activation state continuously and FIG. 5 illustrates a case that another one memory cell array is changed into another one. Hereinafter, FIGS. 5 and 6 will be explained in division.

Referring to the timing diagram of FIG. 4, when turning on a semiconductor memory device, the bls control units 16a and 16b are set to a power voltage Vdd level for outputting a control signal.

When the memory cell array MCA(i) is selected as an activation state by an active control signal ACT, the control signals bls_up(i) and bls_down(i) which are provided to the switching arrays 20b and 20c are set to a high voltage level Vpp in order to make the bit line sense amplifier blsa which is adjacent to the memory cell array MCA(i) connect, and the memory cell array MCA(i) is activated. At this time, the control signals bls_down(i−1) and bls_up(i+1) provided to the switching arrays 20a and 20d which are adjacent to the memory cell arrays MCA(i−1) and MCA(i+1) which are non-activated and adjacent to the memory cell array MCA(i) are set to a ground voltage level from the power voltage Vdd level which is set at present. Accordingly, the memory cell arrays MCA(i−1) and MCA(i+1) are not connected to the adjacent bit line sense amplifier blsa.

Successively, when the memory cell array MCA(i) is selected to an active state continuously, the control signals bls_up(i) and bls_down(i) of the switching arrays 20b and 20c being outputted the present MCA(i) to a high voltage level Vpp in an active state maintain a high voltage level Vpp at a precharge period and the next active period, continuously.

Now we will consider a different case from the above-described case. Here, the control signals bls_up(i+1) and bls_down(i−1) of the switching arrays 20a and 20d which are adjacent to the memory cell arrays MCA(i) and MCA(i+1) transition from ground voltage level to Vdd at a precharge period and thereafter transition to ground voltage level at the next active period.

Such precharge and activation periods are determined by an active control signal ACT and a precharge signal PCG which are outputted from a row control unit 14 to each bls/blsa control unit 16.

Accordingly, when the same memory cell array is repeatedly selected as an active state, a level of the control signal of each bls control unit is controlled in order to have a voltage level as shown in the timing diagram of FIG. 4 so that each switching array is switched respectively.

When another memory cell array is selected to be in an active state, the change of control signal level of each bls control unit is explained with reference to FIG. 5.

FIG. 5 is a timing diagram in which memory cell arrays MCA(i), MCA(i−1), MCA(i+1) and MCA(i) are successively selected in turn as an active state. First, when a semiconductor memory device is turned on, the control signals bls_up(i) and bls_down(i) applied to the switching arrays 20b and 20c are set to a high voltage level Vpp in order to make a bit line sense amplifier blsa which is adjacent to a memory cell array MCA(i) connect and the memory cell array MCA(i) is activated.

At this time, the control signals bls_down(i−1) and bls_up(i+1) applied to the switching arrays 20a and 20d which are adjacent to the memory cell arrays MCA(i−1) and MCA(i+1) which are non-activated and adjacent to the memory cell array MCA(i) are set to a ground voltage level from the power voltage Vdd level which is set at present.

The memory cell array MCA(i+1) is selected as an active state, a level of the control signal bls_up(i+1) applied to the switching array 20d transitions to Vdd from ground when precharging and to Vpp at an activation point, thereby connecting the memory cell array MCA(i+1) and bit line sense amplifiers blsa which are adjacent to the memory cell array MCA(i+1).

Control signal bls_down(i) applied to the switching array 20c maintains a level Vpp when the memory cell array MCA(i) is activated, at a precharge period and transitions to ground when the memory cell array MCA(i+1) is activated. And, the control signal bls_up(i) applied to the switching array 20b maintains a level Vpp when the memory cell array MCA(i) is activated, regardless of a precharge and an activation of the MCA(i+1).

At same time the control signal bls_down(i−1) applied to the switching array 20a transitions from ground to Vdd when precharging when the memory cell array MCA(i) is activated and maintains the level when the memory cell array MCA(i+1) is activated.

When the memory cell array MCA(i−1) is selected to be active, the control signal bls_down(i−1) applied to the switching array 20a maintains a level Vdd, which is a the voltage when the memory cell array MCA(i+1) is activated, when precharging and thereafter transitions to Vpp at an activation point, thereby being connected the memory cell array MAC(i−1) and bit line sense amplifiers blsa which are adjacent to the memory cell array MAC(i−1).

The control signal bls_up(i) applied to the switching array 20b maintains a level Vpp when the memory cell array MCA(i+1) is activated, when precharging and transitions to ground level when the memory cell array MCA(i−1) is activated. The control signal bls_down(i) applied to the switching array 20c transitions from ground to Vdd level when precharging, when the memory cell array MCA(i+1) is activated and thereafter also maintains the level when the memory cell array MCA(i−1) is activated.

The control signal bls_up(i+1) applied to the switching array 20d maintains a level Vpp when the memory cell array MCA(i+1) is activated, regardless of a precharge and an activation of the MCA(i−1).

Successively, when the memory cell array MCA(i) is selected as an active state, the control signal bls_down(i−1) applied to the switching array 20a maintains a high voltage Vpp level, which is a voltage when the memory cell array MCA(i−1) is activated, when precharging and thereafter ascends to a ground voltage level at an activation point of the memory cell array MCA(i).

The control signal bls_up(i) applied to the switching array 20b transitions to a power voltage Vdd level when precharging, from a ground voltage level when the memory cell array MCA(i−1) is activated and to a high voltage level Vpp when the memory cell array MCA(i) is activated. And, when precharging, the control signal bls__down(i) applied to the switching array 20c stays at the Vdd level when the memory cell array MCA(i−1) is activated and thereafter ascends to a high voltage Vpp level when the memory cell array MCA(i) is activated. Accordingly, the memory cell array MCA(i) and the bit line sense amplifiers, which are adjacent to the memory cell array MCA(i) are connected with each other.

When precharging, the control signal bls__up(i+1) applied to the switching array 20d maintains voltage Vpp as the memory cell array MCA(i−1) is activated and thereafter transitions to a ground voltage level when the memory cell array MCA(i) is activated.

Figure 6:
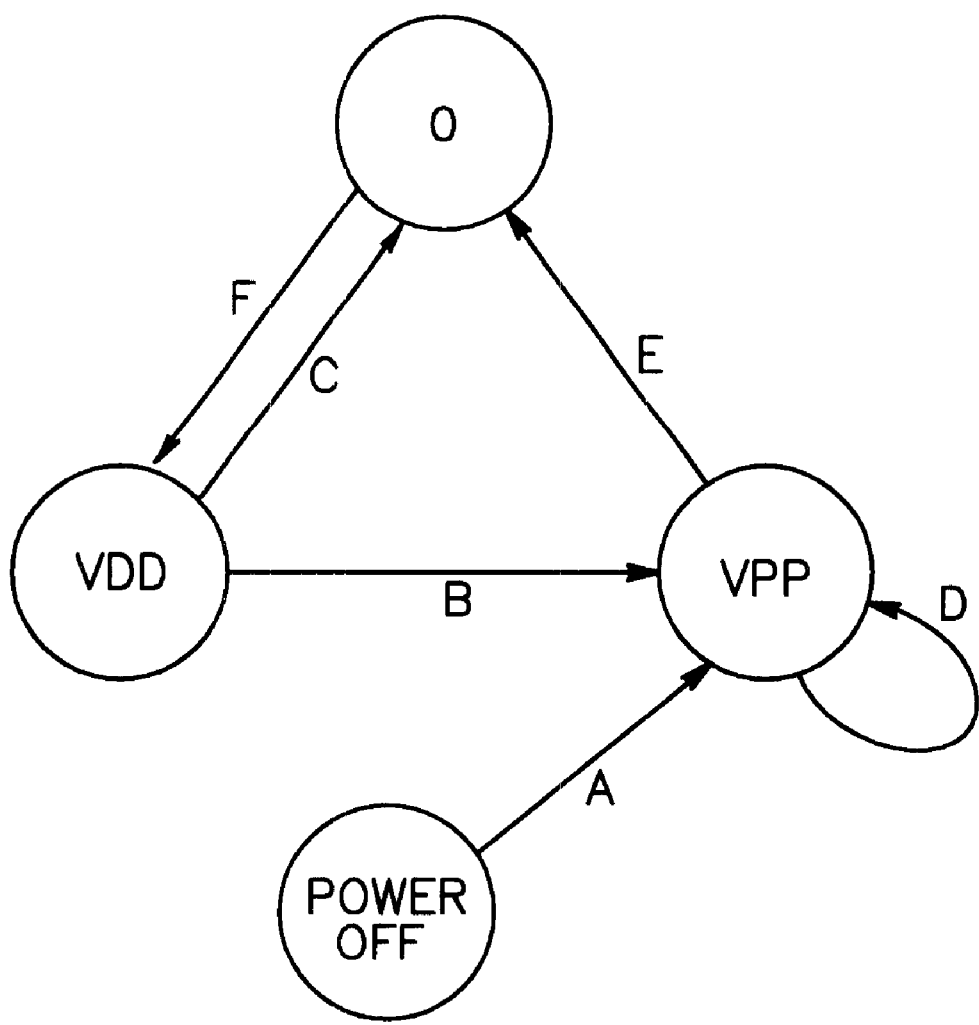
FIG. 6 is a state diagram illustrating another embodiment of a connection method of a bit line of a semiconductor memory device in accordance with the present invention.

As shown in FIG. 6, at the beginning state, the control signal applied to each switching array is set to a high voltage Vpp level. Thereafter the voltage changes according to a precharge and an activation as described with respect to FIG. 3. A repeat explanation will be omitted.

In the present invention, in a state where control signals applied to switching arrays is set to a high voltage Vpp, if it is unnecessary to make a corresponding switching array off because an adjacent memory cell array is not activated, the level remains at the above state. In a state where a control signal is set to voltage Vpp, if an adjacent other memory cell array is activated, the control signal maintains until a precharge and thereafter transitions to a ground voltage level.

As a result, the bit line selecting control unit, when control signal applied to switching arrays is a high voltage level comprises a first mode for maintaining it the high voltage level during a precharge period and successively an activation period; a second mode for lowering it to a ground voltage level during successively an activation period after maintaining a high voltage level during the precharge period; a third mode for maintaining it a power voltage level during a precharge period and raising it to a high voltage level during successively activation period when the control signal is a power voltage level at the present activation period; a fourth mode for maintaining the power voltage level during a precharge period and thereafter lowering to the ground voltage level during a successive activation period; a fifth mode for maintaining the power voltage level during the precharge period and the successive activation period; a sixth mode for raising to the power voltage level at the precharge period when the control signal is the ground voltage level at the present activation period and thereafter to a high voltage level at a successive activation period; a seventh mode for raising to the power voltage level at the precharge period and thereafter maintaining the power voltage level at a successive activation period; and an eighth mode for raising to the power voltage level at the precharge period and thereafter lowering to the ground voltage level at a successive activation period.

Therefore, changing the high voltage Vpp level are restricted in many cases. Accordingly, the number of on/off of the switching array is decreased, thereby reducing the current consumption, in particular, in a refresh mode, for examples, a self-refresh mode and an automatic refresh mode, in a case that an activation order of memory cell arrays and their word lines can be determined in a chip, the change of a state of the control signal applied to the switching array for selecting a bit line can be minimized, thereby reducing the current consumption as much as the corresponding volume.

The inventions described and claimed herein offer operational advantages over the known art. Consumption of power by a semiconductor memory device can be reduced and therefore the usefulness of various electronic appliances which rely on semiconductor memory devices is enhanced.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalents of such meets and bounds are therefore intended to be embraced by the appended claims.

What is claimed is:

1. A semiconductor memory device comprising:
    a plurality of memory cell arrays;
    bit line sense amplifier arrays, each of which includes a bit line sense amplifier, arranged between shared memory cell arrays, and at least one switching array arranged between the bit line sense amplifiers and the memory cell arrays being corresponding to the bit line sense amplifiers, respectively, for switching connection states therebetween; and
    a bit line selection control means for controlling repeatedly activation and precharge periods of respective memory cell arrays and providing control signals corresponding to the activation and precharge periods of the switching arrays,
    wherein at the present activation period, the control signals are divisionally provided as follows:
        when the control signal is a high voltage level, a first mode for maintaining the high voltage level during a precharge period and successively an activation period, a second mode for lowering it to a ground voltage level during successively an activation period after maintaining the high voltage level during the precharge period;
        when the control signal is a power voltage level, a third mode for maintaining a power voltage level during a precharge period and raising it to a high voltage level during successively activation period when the control signal is a power voltage level at the present activation period, a fourth mode for maintaining the power voltage level during a precharge period and thereafter lowering to the ground voltage level during a successive activation period, a fifth mode for maintaining the power voltage level during the precharge period and the successive activation period;
        when the control signals is the ground voltage level, a sixth mode for raising to the power voltage level at the precharge period when the control signal is the ground voltage level at the present activation period and thereafter to a high voltage level at a successive activation period, a seventh mode for raising to the power voltage level at the precharge period and thereafter maintaining the power voltage level at a successive activation period, and an eighth mode for raising to the power voltage level at the precharge period and thereafter lowering to the ground voltage level at a successive activation period; and
    the bit line selection control means provides control signals of modes corresponding to the activation states of the respective memory cell arrays to the switching arrays.

2. The memory device according to claim 1, wherein the bit line selection control means provides a control signal of the first mode to the switching arrays which are adjacent to the activated memory cell arrays, when the same memory cell array is selected as an active state continuously, a control signal of the eighth mode to the switching arrays between the bit line sense amplifiers which are connected to the activated memory cell arrays and the non-activated memory cell arrays, and control signals of the first and fifth modes to the rest switching arrays according to the present level.

3. The semiconductor memory device according to claim 1, wherein the bit line selection control means provides control signals of the first, third and sixth modes to the switching arrays which are adjacent to the activated memory cell arrays according to the present level, when the memory cell arrays are selected with difference at the present activation period and a successive activation period, respectively, control signals of the second, fourth, and eighth modes to the switching arrays between the bit line sense amplifiers which are connected to the activated memory cell arrays and the non-activated memory cell arrays, and control signals of the first, fifth, and seventh modes to the rest switching arrays according to the present level.

4. A method of operating the connections of bit lines of a semiconductor memory device in which bit line sense amplifiers for sensing and amplifying data are shared by memory cell arrays which are adjacent to the bit line sense amplifiers and activation and precharge periods are repeated, a memory cell array to be activated being selected at a respective activation periods, connection states between the respective bit line sense amplifiers and the memory cell arrays, which are adjacent to each other, being determined according to the control signals applied to the switching arrays, wherein the control signals corresponding to the activations are provided divisionally as follows:

at a present activation period, when the control signal is at a high voltage level, a first mode for maintaining the high voltage level during a precharge period and during a successive activation period, a second mode for transitioning the control signal to a ground voltage level during an activation period after maintaining the first voltage level during a precharge period;

at the present activation period, when the control signal is a power voltage level, a third mode for maintaining a power voltage level during a precharge period and raising it to the high voltage level during a successive activation period when the control signal is at a power voltage level at the present activation period, a fourth mode for maintaining the control signal at the power voltage level during a precharge period and thereafter lowering it to the ground voltage level during a successive activation period, a fifth mode for maintaining the control signal at the power voltage level during the precharge period and the successive activation period;

at the present activation period, when the control signal is at ground voltage level, a sixth mode for raising the control signal to the power voltage level at the precharge period when the control signal is the ground voltage level at the present activation period and thereafter to a high voltage level at a successive activation period, a seventh mode for raising the control signal to the power voltage level at the precharge period and thereafter maintaining the power voltage level at a successive activation period, and an eighth mode for raising the control signal to the power voltage level at the precharge period and thereafter lowering it to the ground voltage level at a successive activation period; and providing the control signals corresponding to the activation states of the activation periods of the respective memory cell arrays to the switching arrays by adapting any one among the modes.

5. A method according to claim 4, wherein the start voltage level applied to the switching arrays is a power voltage level when a power source of the semiconductor memory device is turned on.

6. A method according to claim 4, wherein the start voltage level applied to the switching arrays is a high voltage level when a power source of the semiconductor memory device is turned on.

7. A method according to claim 4, wherein the bit line selection control means provides a control signal of the first mode to the switching arrays which are adjacent to the activated memory cell arrays, when same memory cell array is selected as an active state continuously, a control signal of the eighth mode to the switching arrays between the bit line sense amplifiers which are connected to the activated memory cell arrays and the non-activated memory cell arrays, and control signals of the first and fifth modes to the rest switching arrays according to the present level.

8. A method according to the claim 4, wherein the bit line selection control means provides control signals of the first, third and sixth modes to the switching arrays which are adjacent to the activated memory cell arrays according to the present level, when the memory cell arrays are selected with difference at the present activation period and a successive activation period, respectively, control signals of the second, fourth, and eighth modes to the switching arrays between the bit line sense amplifiers which are connected to the activated memory cell arrays and the non-activated memory cell arrays, and control signals of the first, fifth, and seventh modes to the rest switching arrays according to the present level.

9. A method according to claim 4, wherein the operations of the control signals in the modes are performed at a self refresh mode.

10. A method according to claim 4, wherein the operations of the control signals in the modes are performed at an automatic refresh mode.

11. In a semiconductor memory device comprising a plurality of bit line sense amplifier units each of which includes a predetermined number of bit line sense amplifiers and a plurality of memory cell arrays each disposed between adjacent two bit line sense amplifier units with the plurality of the memory cells in accordance with a voltage level of bit line selection signals, the method comprising:

making the bit line selection signal be a high voltage level Vpp if a memory cell array assigned to the bit line selection signal is activated; and making the bit line selection be ground level if a memory cell array adjacent to said assigned memory cell array is activated, wherein the response to the precharge operation, the bit line selection signal is maintained at the high voltage level if the bit line selection signal has been at the high voltage level, and transits to a supply voltage level Vdd if the bit line selection signal has been at the ground level.

* * * * *